(12) United States Patent
Verwys et al.

(10) Patent No.: US 10,668,853 B2
(45) Date of Patent: Jun. 2, 2020

(54) INTERIOR A-PILLAR ELECTROLUMINESCENT ASSEMBLY OF A VEHICLE

(71) Applicant: Honda Motor Co., Ltd., Tokyo (JP)

(72) Inventors: Nichole A. Verwys, Marysville, OH (US); Zachary Segraves, Redwood City, CA (US)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 15/639,357

(22) Filed: Jun. 30, 2017

(65) Prior Publication Data
US 2019/0001874 A1 Jan. 3, 2019

(51) Int. Cl.
| | |
|---|---|
| *B60Q 3/20* | (2017.01) |
| *B60Q 3/80* | (2017.01) |
| *H01L 27/32* | (2006.01) |
| *F21S 43/13* | (2018.01) |
| *B60Q 9/00* | (2006.01) |
| *B60Q 3/217* | (2017.01) |
| *B60Q 3/54* | (2017.01) |
| *B60Q 3/74* | (2017.01) |

(Continued)

(52) U.S. Cl.
CPC ............ *B60Q 3/20* (2017.02); *B60Q 3/217* (2017.02); *B60Q 3/54* (2017.02); *B60Q 3/745* (2017.02); *B60Q 3/80* (2017.02); *B60Q 9/00* (2013.01); *F21S 43/13* (2018.01); *H01L 27/3239* (2013.01); *F21Y 2115/20* (2016.08); *H01L 51/502* (2013.01); *H01L 2251/5361* (2013.01)

(58) Field of Classification Search
CPC ... B60Q 3/51; B60Q 3/54; B60Q 3/78; B60Q 3/80; B60Q 3/20; F21S 43/13; H01L 27/3239
See application file for complete search history.

(56) References Cited

U.S. PATENT DOCUMENTS

| | | |
|---|---|---|
| 3,185,650 A | 5/1965 | Gurnee et al. |
| 4,663,214 A | 5/1987 | Coburn, Jr. |

(Continued)

FOREIGN PATENT DOCUMENTS

| | | |
|---|---|---|
| CN | 202071757 U | 12/2011 |
| DE | 10319396 | 11/2004 |

(Continued)

OTHER PUBLICATIONS

English Machine Translation of JPH069914Y2 provided by Google Patents (Year: 1994).*

(Continued)

*Primary Examiner* — Zheng Song
(74) *Attorney, Agent, or Firm* — Rankin, Hill & Clark LLP

(57) ABSTRACT

An electroluminescent assembly on a vehicle A-pillar and a method for installing the same on a vehicle A-pillar includes a panel positioned over an interior surface of the A-pillar, the panel including a plurality of facets extending along a length of the panel. The electroluminescent assembly covers the three facets. The portion of the electroluminescent assembly that covers a middle facet provides real-time visual indicators to an occupant of the vehicle based on signals derived from a vehicle electronic system. The portion of the electroluminescent assembly that covers the other two facets provide illumination to an interior and exterior of the vehicle.

30 Claims, 6 Drawing Sheets

(51) Int. Cl.
    *F21Y 115/20*      (2016.01)
    *H01L 51/50*       (2006.01)

(56) References Cited

U.S. PATENT DOCUMENTS

| | | | |
|---|---|---|---|
| 4,934,753 | A | 6/1990 | Gajewski |
| 5,321,069 | A | 6/1994 | Owens |
| 5,336,965 | A | 8/1994 | Meyer et al. |
| 5,339,550 | A | 8/1994 | Hoffman |
| 5,434,013 | A | 7/1995 | Fernandez |
| 5,593,782 | A | 1/1997 | Budd |
| 6,123,871 | A | 9/2000 | Carroll |
| 6,517,226 | B1 * | 2/2003 | Zimmermann ......... G09F 13/22 |
| | | | 313/512 |
| 6,536,928 | B1 | 3/2003 | Hein et al. |
| 6,561,667 | B2 | 5/2003 | Stapf |
| 6,616,312 | B2 | 9/2003 | Carter |
| 6,641,276 | B1 | 11/2003 | Macher et al. |
| 6,673,437 | B2 | 1/2004 | Kohla et al. |
| 6,758,510 | B1 | 7/2004 | Starling |
| 7,118,239 | B2 | 10/2006 | Itoh et al. |
| 7,195,381 | B2 | 3/2007 | Lynam et al. |
| 7,210,829 | B2 | 5/2007 | Okazaki et al. |
| 7,234,850 | B2 | 6/2007 | Garcia et al. |
| 7,237,933 | B2 | 6/2007 | Radu et al. |
| 7,588,340 | B2 | 9/2009 | Bauer et al. |
| 7,810,969 | B2 | 10/2010 | Blackmore et al. |
| 8,016,465 | B2 | 9/2011 | Egerer et al. |
| 8,106,578 | B2 | 1/2012 | Brown et al. |
| 8,113,695 | B2 | 2/2012 | Meinke et al. |
| 8,162,520 | B2 | 4/2012 | Penner |
| 8,256,945 | B2 | 9/2012 | Choquet |
| 8,333,492 | B2 | 12/2012 | Dingman et al. |
| 8,339,252 | B2 | 12/2012 | Ozaki |
| 8,345,095 | B2 | 1/2013 | Oizumi et al. |
| 8,408,766 | B2 | 4/2013 | Wilson et al. |
| 8,456,082 | B2 | 6/2013 | Stiles et al. |
| 8,469,562 | B2 | 6/2013 | Marzorati et al. |
| 8,470,388 | B1 | 6/2013 | Zsinko et al. |
| 9,067,556 | B2 | 6/2015 | Bosch et al. |
| 9,315,148 | B2 | 4/2016 | Schwenke et al. |
| 2004/0090317 | A1 * | 5/2004 | Rothkop ................ B60Q 9/008 |
| | | | 340/435 |
| 2004/0110026 | A1 | 6/2004 | Richards et al. |
| 2005/0190570 | A1 | 9/2005 | Roessler |
| 2006/0034092 | A1 | 2/2006 | Okazaki et al. |
| 2006/0097633 | A1 | 5/2006 | Cho et al. |
| 2006/0138948 | A1 | 6/2006 | Ray et al. |
| 2009/0129107 | A1 | 5/2009 | Egerer et al. |
| 2009/0219468 | A1 | 9/2009 | Barton et al. |
| 2009/0251917 | A1 | 10/2009 | Wollner et al. |
| 2010/0265731 | A1 | 10/2010 | Van Herpen et al. |
| 2010/0283007 | A1 | 11/2010 | Robinson |
| 2010/0302020 | A1 * | 12/2010 | Lenneman ............ B60K 35/00 |
| | | | 340/441 |
| 2010/0321946 | A1 | 12/2010 | Dingman et al. |
| 2012/0001406 | A1 | 1/2012 | Paxton et al. |
| 2014/0376243 | A1 | 12/2014 | Schwenke et al. |
| 2015/0165964 | A1 * | 6/2015 | Mori ...................... B60Q 9/00 |
| | | | 362/548 |
| 2016/0280128 | A1 | 9/2016 | Cannon |
| 2016/0288709 | A1 * | 10/2016 | Nespolo ................ B60Q 9/008 |
| 2016/0325674 | A1 | 11/2016 | Krull et al. |
| 2017/0246989 | A1 | 8/2017 | Ben Abdelaziz |
| 2018/0009393 | A1 * | 1/2018 | Nagashima ............ B62D 25/04 |
| 2018/0218611 | A1 * | 8/2018 | Nagura .................. G08G 1/167 |

FOREIGN PATENT DOCUMENTS

| | | | |
|---|---|---|---|
| EP | 1053910 | 2/2003 | |
| EP | 1188615 | 6/2004 | |
| EP | 1625971 | 2/2006 | |
| GB | 2495964 | 5/2013 | |
| JP | H069914 Y2 * | 3/1994 | ............ B60K 37/00 |
| JP | 2006137227 | 6/2006 | |
| WO | 2003061351 | 7/2003 | |
| WO | 20080169978 | 2/2008 | |

OTHER PUBLICATIONS

Internet Website: http://www.autoblog.com/2004/08/04/volvo-invents-blis-blind-spot-info-system-actual-happiness/, auto blog, by Christopher Diken, Aug. 4, 2004.

Internet Website: http://www.dedona.com/blind-spot-monitoring-and-alert-systems/, DeDona Tint & Sound, Nov. 5, 2013.

Internet Website: http://www.wranglerforum.com/f274/interior-paint-job-212857.html; regarding blog entitled "Interior paint job?" by Jakebar777 and Darkfire; printed Jun. 30, 2017.

Office Action of U.S. Appl. No. 15/429,858 dated Jul. 5, 2018, 11 pages.

Office Action of U.S. Appl. No. 15/639,306 dated Sep. 4, 2018, 19 pages.

NOA of U.S. Appl. No. 15/639,306 dated Feb. 21, 2019, 17 pages.

NOA of U.S. Appl. No. 15/639,734 dated Apr. 10, 2019, 33 pages.

Office Action of U.S. Appl. No. 16/418,856 dated Sep. 10, 2019, 17 pages.

Office Action of U.S. Appl. No. 16/418,856 dated Feb. 18, 2020, 10 pages.

* cited by examiner

INTERIOR A-PILLAR ELECTROLUMINESCENT ASSEMBLY OF A VEHICLE

BACKGROUND

Attempts have been made to provide interior illumination for vehicles. One difficulty in providing such illumination is doing so in a manner that provides increased functionality and does not detract from the appearance of the vehicle.

SUMMARY

According to one aspect, an A-pillar assembly for a vehicle includes a panel covering an interior portion of an A-pillar. The panel has an interior surface that is visible from within an associated passenger compartment of the vehicle. The A-pillar assembly includes an electroluminescent assembly that emits light when activated. The electroluminescent assembly is disposed on the interior surface of the panel. The electroluminescent assembly is configured such that light emitted by the electroluminescent assembly during vehicle operation provides real-time visual indicators to a vehicle occupant.

According to another aspect, a method of installing an electroluminescent assembly on an A-pillar of a vehicle includes providing a vehicle including an A-pillar, and mounting a panel to cover an interior portion of the A-pillar. The panel includes an interior surface facing towards an interior of the vehicle. An electroluminescent assembly is applied to the interior surface of the panel to cover at least a portion of the interior surface of the panel. The electroluminescent assembly emits light when activated, and is configured such that light emitted by the electroluminescent assembly during vehicle operation provides real-time visual indicators to a vehicle occupant.

According to a further aspect, a method of providing real-time visual indicators to an occupant of a vehicle includes providing an electroluminescent assembly that emits light when activated. The electroluminescent assembly is disposed on an interior surface of a panel that covers an A-pillar of a vehicle. The interior surface of the panel faces a passenger compartment of the vehicle. The electroluminescent assembly is placed in communication with a vehicle electronic system, and is activated during vehicle operation to provide real-time visual indicators to an occupant of the vehicle based on signals derived from the vehicle electronic system.

DETAILED DESCRIPTION

Figure 1:
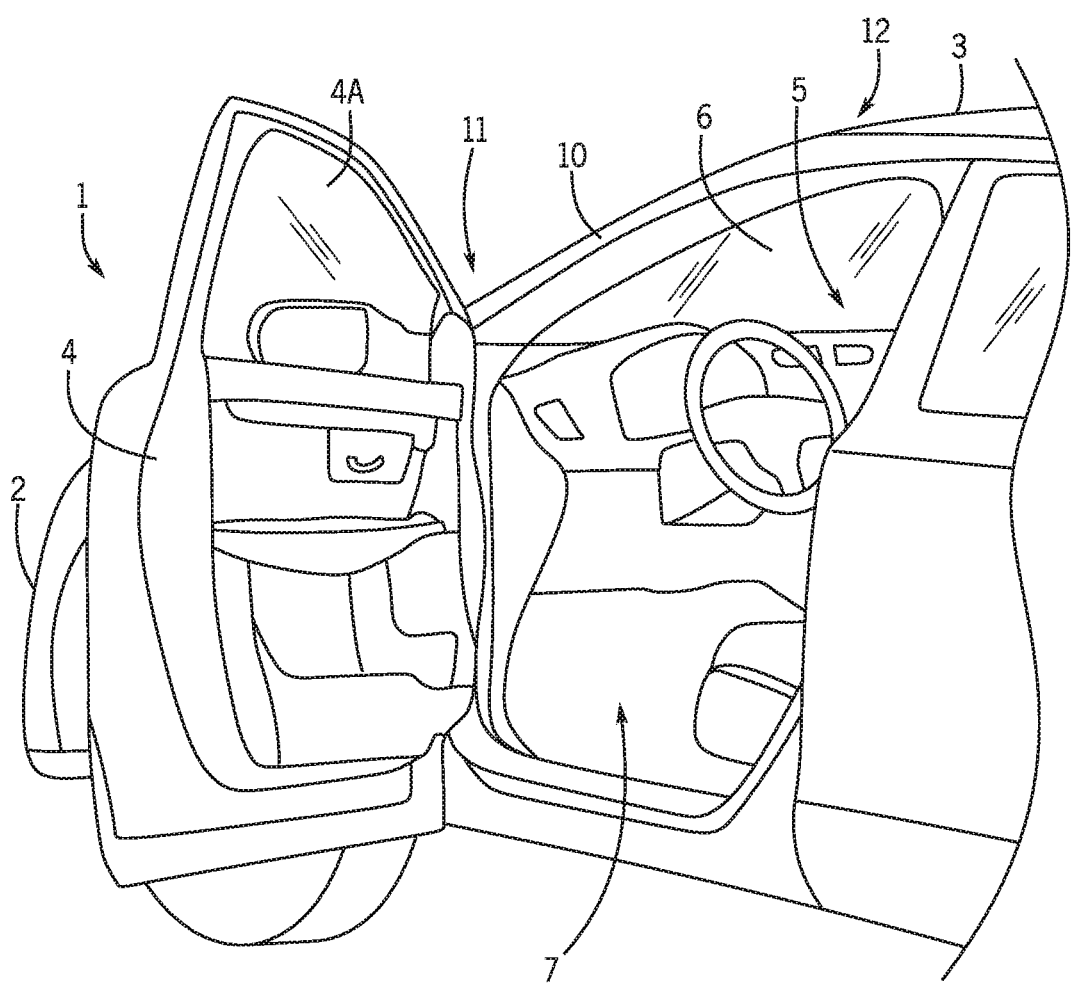
FIG. 1 is a perspective view of a driver's side of a vehicle with a passenger door in an open position.
Figure 2:
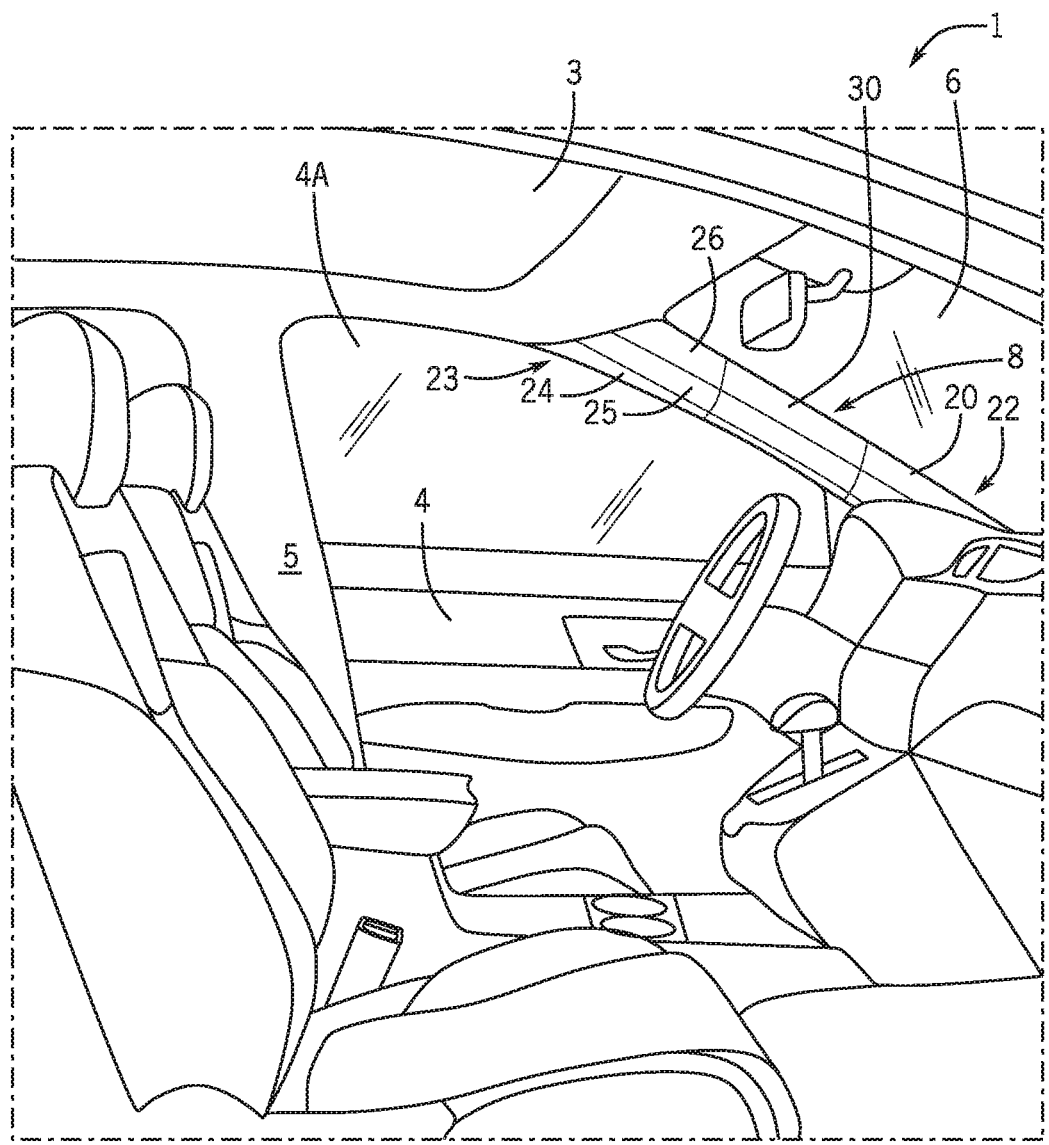
FIG. 2 is a right side perspective view of an interior of the vehicle of FIG. 1 showing an A-pillar assembly according to an exemplary embodiment.

Referring now to the figures wherein the showings are for purposes of illustrating one or more embodiments only and not for purposes of limiting the same, FIGS. 1 and 2 depict a vehicle 1 including an A-pillar 10 on the driver's side (i.e. left side) of the vehicle 1. As used herein, the "left" side of the vehicle will be the portion of the vehicle that is to the left of a vehicle passenger who is facing towards the front of the vehicle, and the "right" side of the vehicle will be the opposite portion of the vehicle that is to the right of a vehicle passenger who is facing towards the front of the vehicle. The A-pillar 10 has a first end 11 connected to a part of a vehicle body 2, and an opposite second end 12 connected to the roof 3. The vehicle 1 includes a front windshield 6, and a passenger door 4 that is moveable between an open position (FIG. 1) and a closed position (FIG. 2) to allow access to a passenger compartment 5 of the vehicle 1 through an entryway 7.

Figure 3:
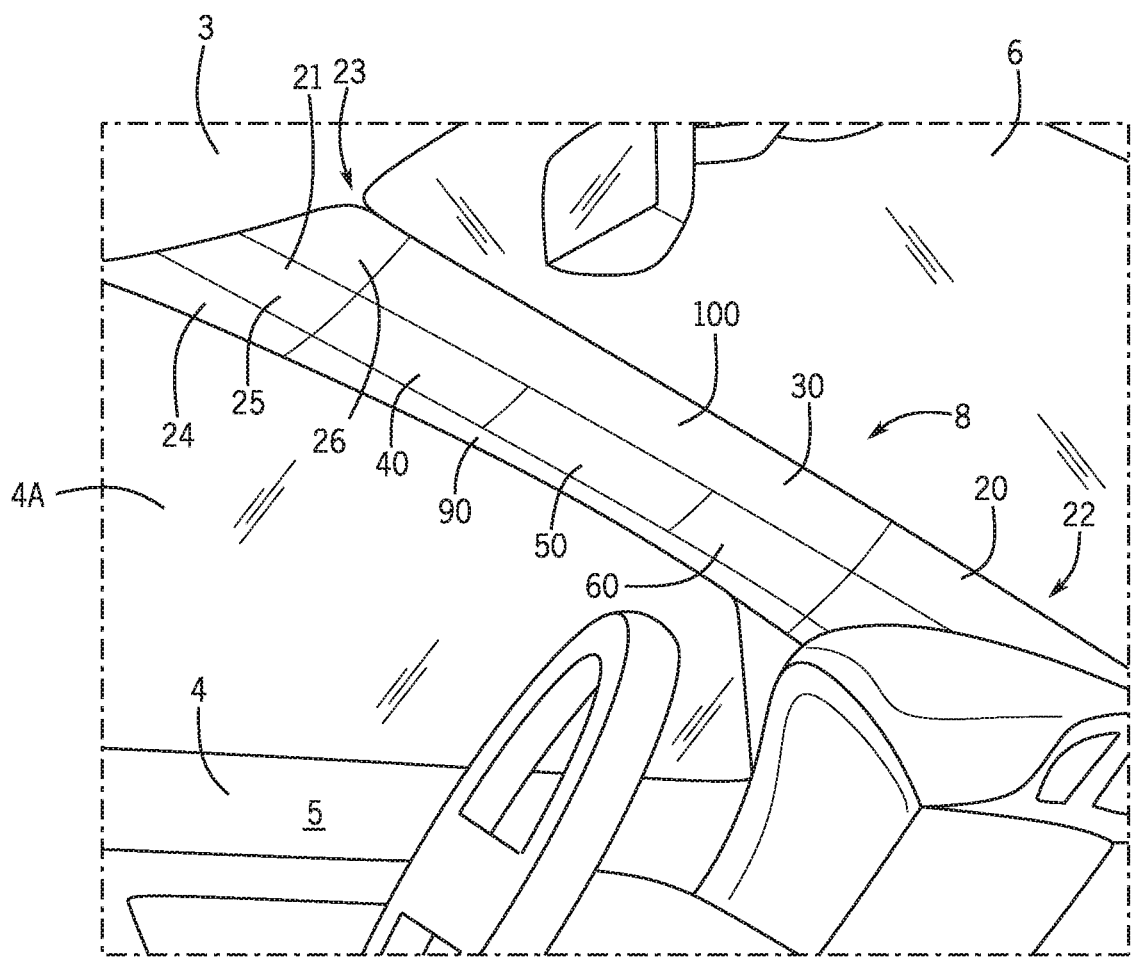
FIG. 3 is a close up view of FIG. 2 showing details of the A-pillar assembly.
Figure 4:
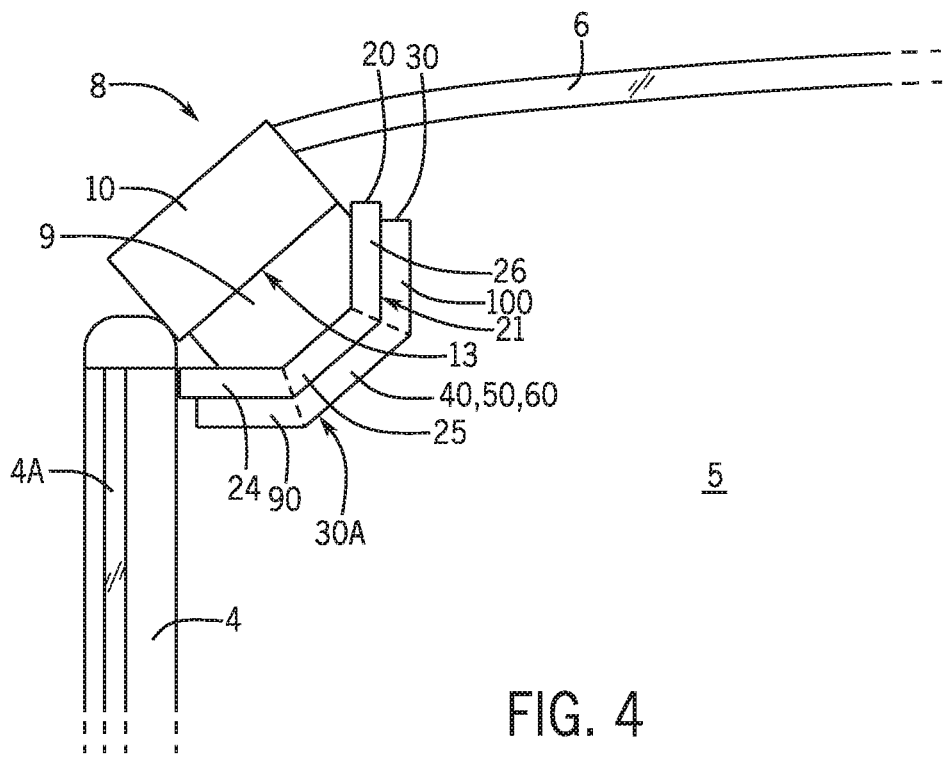
FIG. 4 is a schematic cross-sectional view of the A-pillar assembly of FIG. 2.

With additional reference to FIGS. 3 and 4, which show an exemplary vehicle A-pillar assembly 8, the vehicle 1 includes a trim piece or panel 20 that at least partially covers an interior portion 13 of the A-pillar 10. The panel 20 can be mounted to the A-pillar 10, or mounted relative to the A-pillar 10, to conceal the interior portion 13 of the A-pillar 10, or to conceal a vehicle component 9, which can include for example, an air bag, electrical components, or the like. The panel 20 includes an interior surface 21, which faces or is directed towards the passenger compartment 5 and opposite from the A-pillar 10 (i.e. at least a portion of the interior surface 21 is visible to a vehicle occupant). The panel 20 has a length extending between a first end 22 (i.e. lower end) near the vehicle body 2, and an second end 23 (i.e. upper end) near the vehicle roof 3.

In several embodiments, the interior surface 21 of the panel 20 includes a plurality of facets. As depicted in the figures for example, the interior surface 21 can include a first facet 24, a second facet 25, and a third facet 26 that extend along the length of the panel 20 between the first end 22 and the second end 23 of the panel 20. As depicted, the first facet 24 is closer to the door 4 than are the second and third facets 25, 26, and generally faces towards the door 4 more so than the second and third facets 25, 26. The second facet 25 is situated between the first and third facets 24, 26, and generally faces towards an occupant of the vehicle 1 more so than the first and third facets 24, 26. The third facet 26 is closer to the front windshield 6 than are the first and second facets 24, 25, and generally faces the front windshield 6 more so than the first and second facets 24, 25. The panel 20 can include additional facets and facets that are differently arranged than as depicted in the figures. In an alternative embodiment, the interior surface 21 of the panel 20 is a smooth, curved surface and does include a plurality of distinct facets.

An electroluminescent assembly 30 is applied to the interior surface 21 of the panel 20, and generally overlies the facets 24, 25, and 26. The electroluminescent assembly 30 emits light when activated, which is accomplished by supplying power to the electroluminescent assembly 30. As will be described in more detail herein, the electroluminescent assembly 30 comprises a thin flexible sheet-like structure having two major surfaces that are oppositely directed from one another. The illumination mechanism of the assembly is not limited in any way. Illustrative examples include a light emitting diode and an organic light-emitting diode configured in a film or sheet that is positionable on the interior surface 21. In several embodiments, only one of the two major surfaces (e.g. exposed surface 30A, FIG. 5) of the electroluminescent assembly 30 is a light emitting surface and is directed towards the passenger compartment 5 of the vehicle 1. The other of the two major surfaces is not a light emitting surface as it faces the panel 20. Because the electroluminescent assembly 30 comprises a thin sheet-like structure, it does not require large housings that are normally required for conventional lighting, and because the electroluminescent assembly 30 is relatively thin compared to conventional lighting fixtures, such as LED fixtures, it does add significantly to the bulk of the panel 20. Further, even with the electroluminescent assembly 30 being positioned between the component 9 and the passenger compartment 5, mounting the electroluminescent assembly 30 to the interior surface 21 of the panel 20 eliminates the need to install a lamp housing or portion of a lamp between the panel 20 and the A-pillar 10 where it might otherwise interfere with the configuration, positioning, or functioning of the component 9 concealed behind the panel 20. Still further, because the electroluminescent assembly 30 is configurable in the form of a flexible film or coating, it can be conformed to the contours and shape of the panel 20, which may include complex curves on the interior surface 21.

Figure 5:
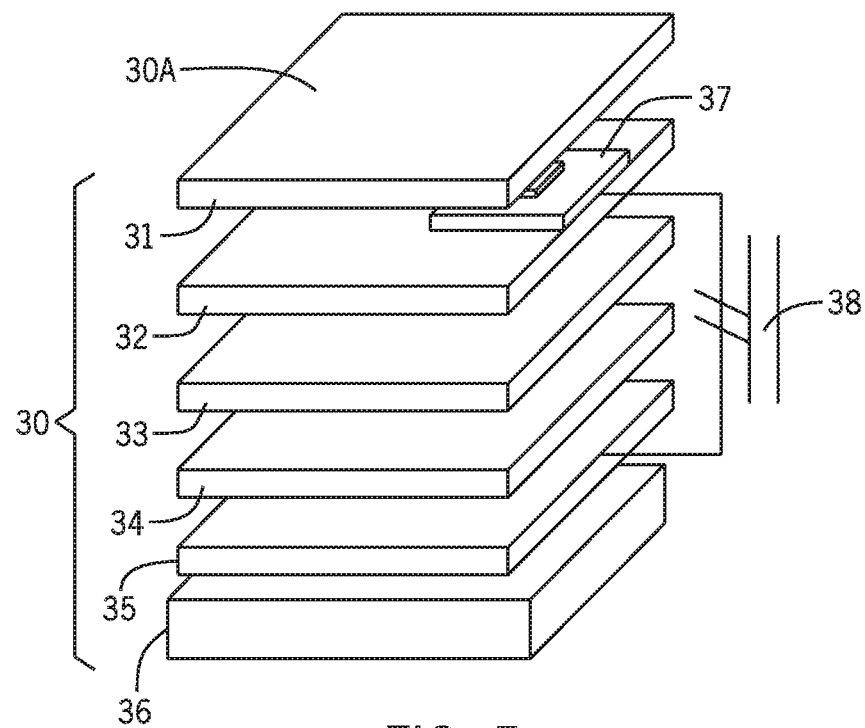
FIG. 5 is a schematic partial exploded view of a portion of an electroluminescent assembly according to an exemplary embodiment.

In a non-limiting example, the electroluminescent assembly 30 may be in the form of electroluminescent lamps disclosed in U.S. Pat. No. 8,470,388, the contents of which is incorporated by reference herein. With reference to FIG. 5, an exemplary schematic stacking arrangement for the electroluminescent assembly 30 is illustrated. As depicted, one or more top layers 31 can be provided as a transparent top coat that presents the exposed surface 30A facing the passenger compartment 5 of the vehicle 1. As used herein, "transparent" refers to a material that is not opaque, and which allows at least some light to be transmitted therethrough, and includes transparent and translucent materials that can be colored or colorless. The one or more top layers 31 provide protection to the electroluminescent assembly 30, and can have a total thickness of 25 microns to 125 microns. When the electroluminescent assembly 30 is not activated and does not emit light, the top layer(s) 31 may provide an appearance of a conventional, non-light-emitting vehicle interior trim piece. That is, when the electroluminescent assembly 30 is not activated, the top layer 31 is not backlit by an underlying phosphor layer 33, and therefore the top layer 31 may appear similar to portion of the panel 20 that may not be covered with the electroluminescent assembly 30. For example, when the electroluminescent assembly 30 is not activated to emit light, the top layer 31 of the electroluminescent assembly 30 may appear to have a chrome, textured, or otherwise opaque appearance.

An electrically conductive top electrode 32 is provided under the one or more top layers 31. The top electrode 32 is a film coating layer that is preferably both electrically conductive and generally transparent to light. Top electrode 32 may comprise such materials as, without limitation, conductive polymers (PEDOT), carbon nanotubes (CNT), antimony tin oxide (ATO) and indium tin oxide (ITO). An illustrative commercial product is CLEVIOS™ conductive, transparent and flexible polymers (available from Heraeus Clevios GmbH of Leverkusen, Germany) diluted in isopropyl alcohol as a thinner/drying agent. CLEVIOS™ conductive polymers exhibit relatively high efficacy. In addition, CLEVIOS™ conductive polymers are based on a styrene co-polymer and thus provides a ready mechanism for chemical crosslinking/mechanical bonding with the underlying phosphor layer 33. In a non-limiting example, the top electrode 32 has a thickness of 1 to 25 microns.

A bus bar 37 is interposed between the top layer 31 and the top electrode 32. The bus bar 37 may be provided as a relatively low-impedance strip of conductive material, usually comprised of one or more of the materials usable to produce the bottom or rear electrode 35. In an illustrative example, the bus bar 37 is comprised of silver. The bus bar 37 is typically applied to the peripheral edge of the lit field. Although bus bar 37 is generally depicted as being on top of the top electrode 32 in the figures, the bus bar 37 may be applied adjacent to the top electrode 32, or below the top electrode 32.

Below the top electrode 32, a phosphor layer 33 is provided. Phosphor layer 33 is a semi-conductive film coating layer comprised of a material (such as metal-doped Zinc Sulfide (ZnS)) encapsulated within an electrostatically permeable polymer matrix. When excited by the presence of an alternating electrostatic field generated by an AC signal, the doped ZnS absorbs energy from the field, which it in turn re-emits as a visible-light photon upon returning to its ground state. In a non-limiting example, the phosphor layer 33 comprises about a 2:1 solution of co-polymer and dilute ammonium hydroxide. To this solution, a quantity of metal-doped ZnS based phosphors doped with at least one of copper, manganese and silver (i.e., ZnS:Cu, Mn, Ag, etc.) pre-wetted in a dilute ammonium hydroxide is added to form a supersaturated suspension. In a non-limiting example, the phosphor layer 33 comprises a thickness of 30 to 100 microns.

Below the phosphor layer 33, a dielectric layer 34 is provided that electrically insulates the phosphor layer 33. Dielectric layer 34 may be an electrically non-conductive film coating layer comprising a material (typically Barium Titanate—$BaTiO_3$) possessing high dielectric constant properties encapsulated within an insulating polymer matrix having relatively high permittivity characteristics (i.e., an index of a given material's ability to transmit an electromagnetic field). In an illustrative example, the dielectric layer 34 comprises about a 2:1 solution of co-polymer and dilute ammonium hydroxide. To this solution a quantity of $BaTiO_3$, which has been pre-wetted in ammonium hydroxide, may be added to form a supersaturated suspension. In a non-limiting example, the dielectric layer 34 may comprise at least one of a titanate, an oxide, a niobate, an aluminate, a tantalate, and a zirconate material, among others.

Below the dielectric layer 34, a rear electrode layer 35 is provided that is electrically connected to the conductive lead 38, which is connected to a power source of the vehicle 1 to thereby provide power to the electroluminescent assemblies for illumination thereof. The conductive lead 38 may comprise any of the materials that may be used for the top electrode 32 or the rear electrode 35. The rear electrode layer 35 is a film coating layer that may be a sprayable conductive material and may form the rough outline of the lit EL "field". In a non-limiting example, the rear electrode 35 may be made using a highly conductive, generally opaque material. Examples of such materials include, without limitation, an alcohol/latex-based, silver-laden solution such as SIL-VASPRAY™ available from Caswell, Inc. of Lyons N.Y., and a water-based latex, copper-laden solution such as "Caswell Copper" copper conductive paint, also available from Caswell, Inc., and mixtures thereof.

In a non-limiting example, the rear electrode 35 may be a metal plating wherein a suitable conductive metal material is applied to a non-conductive substrate 36 using any suitable process for the select metal plating. Example types of metal plating include, without limitation, electroless plating, vacuum metalizing, vapor deposition and sputtering. In one embodiment, the rear electrode 35 is provided on the panel 20, which acts as the substrate 36. In another embodiment, the rear electrode 35 is provided on a substrate 36 that is separate from the panel 20, with subsequent layers being formed thereon to provide an electroluminescent assembly 30.

The rear electrode 35 may also be an electrically conductive, generally clear transparent layer such as, without limitation, "CLEVIOS™ S V3" and or "CLEVIOS™ S V4" conductive polymers, available from Heraeus Clevios GmbH of Leverkusen, Germany. This transparent configuration for the rear electrode allows for two-way illumination.

Finally, a primer layer (not shown) may be positioned between the rear electrode 35 and the substrate 36 or the panel 20 acting as the substrate. The primer layer may be oxide-based and may serve to electrically insulate the subsequent conductive and semi-conductive layers from the substrate/transparent panel, and/or may also promote adhesion between substrate 36 or the panel 20 acting as the substrate, and subsequently applied layers. In a non-limiting example, the primer layer may be a transparent layer, such as a transparent polymeric material. Illustrative examples include polyurethane coatings such as single or two-component polyurethane systems.

Additionally, the conductive lead 38 can be electrically connected to a power source of the vehicle 1, to thereby electrically connect the electroluminescent assembly 30 to the power source. During operation, a voltage supply to the conductive lead 38 can be varied to change a brightness of the electroluminescent assembly 30. Also, a frequency of the power supplied to the conductive lead 38 can be varied to change a color of the electroluminescent assembly 30.

In some embodiments, the electroluminescent assembly 30 can be included in a variety of shapes, sizes, configurations, and at a plurality of locations along a length of the panel 20. In accordance with the present disclosure, the panel 20 can include additional electroluminescent assemblies as desired.

Figure 6:
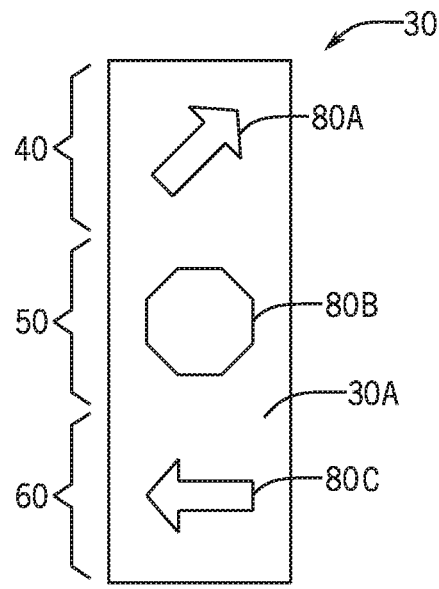
FIG. 6 is a schematic top view of an electroluminescent assembly according to an exemplary embodiment.

With additional reference to FIG. 6, during operation of the vehicle 1—such as when an engine of the vehicle is running, or during powered movement of the vehicle—the electroluminescent assembly 30 may be activated to emit light that provides real-time visual indicators 80 to an occupant of the vehicle (e.g. a driver or passenger of the vehicle). Such real-time visual indicators 80 are presented or arranged in such a way that they provide more than mere illumination, and instead additionally convey information to a vehicle occupant. The real-time visual indicators 80 are not particularly limited by the present disclosure, and may provide warnings, notices, alerts, instructions, information relating to a current condition or situation relating to the vehicle including vehicle components, an occupant of the vehicle, or an environment of the vehicle including an immediate surrounding environment of the vehicle, and combinations thereof. A non-limiting example of conditions of the vehicle that may be indicated by the real-time visual indicators include vehicle performance characteristics or diagnostic information, or the like. Conditions of the vehicle occupants that may be indicated by the real-time visual indicators can include physical conditions of a driver, such as the driver being drowsy or inattentive while driving. Conditions of the surrounding environment that may be indicated by the real-time visual indicators can include proximity warnings, newsfeeds, amber alerts, nearby points of interest, or the like. The real-time visual indicators may include one or more of directional indicators such as turn-by-turn directions from a navigation system, blind spot warnings, a turn signal indicator, and combinations thereof. However, such indicators 80 are not limited to any particular type or combination. Other illustrative examples include maintenance indicators to display information such as fluid levels such as oil or gas (or the need to change one or more fluids such as oil), battery level indicators to display characteristics of one or more batteries on the vehicle, vehicle characteristic indicators (e.g. the current speed of the vehicle), and indicators to display the distance to a desired driving destination. It is also to be understood that the system may be configured for a user to select a particular item to display with one or more of the real-time indicators 80. For example, the system may be configured to allow a user to select which fluid level (such as gas, oil, windshield wiper) to indicate in real-time. In a non-limiting example, the real-time visual indicators include a directional indicator, a blind spot indicator, and a turn signal indicator. It will be appreciated that the one or more real-time visual indicators may or may not be activated to emit light at the same time.

The real-time visual indicators 80 may correspond to signals or data derived from one or more electronic systems of the vehicle 1. The data or signals may be accessed from, sensed by, generated by, or otherwise acquired from or produced by one or more of the vehicle electronic systems. The vehicle electronic systems from which this data or these signals are derived, are not particularly limited and may include one or more vehicle electronic control units associated with a vehicle engine, transmission, body, chassis, passive and active safety features, vehicle performance, driver assistance, interior and exterior environment, vehicle diagnostics, vehicle control, audio/visual entertainment, navigation, electrical systems, telematics, and combinations thereof. The vehicle electronic systems can include a door control unit, engine control unit, electric power steering control unit, human-machine interface (HMI), powertrain control module, transmission control unit; seat control unit, speed control unit, telematics control unit, transmission control unit, brake control module (ABS or ESC), battery management system, central control module, central timing module, general electronic module, body control module, suspension control module, or combinations thereof.

In one embodiment, the electroluminescent assembly 30 communicates with an electronic system of the vehicle 1, wherein the vehicle electronic system may provide real-time signals or data to the electroluminescent assembly 30. Communication between the electroluminescent assembly 30 and the vehicle electronic system may be established through one or more intermediary systems or devices, and such communication may be performed, for example, by using a communication link or connection such as with a wired connection, Wi-Fi connection, Bluetooth connection, etc., between the electroluminescent assembly 30 and the vehicle electronic system. Such communication connection allows the data or signals from the vehicle electronic system to be communicated to the electroluminescent assembly 30 so that the electroluminescent assembly 30 can provided the real-time visual indicators to an occupant that corresponds to such data or signals.

Figure 7:
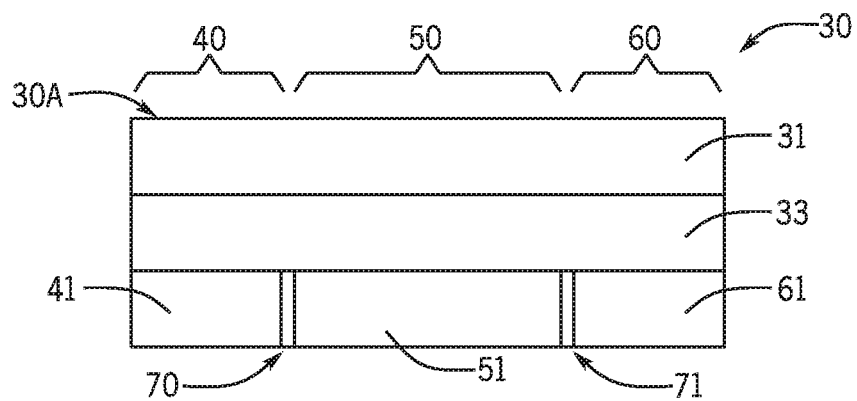
FIG. 7 is a schematic cross-sectional view of an electroluminescent assembly according to an exemplary embodiment.
Figure 8:
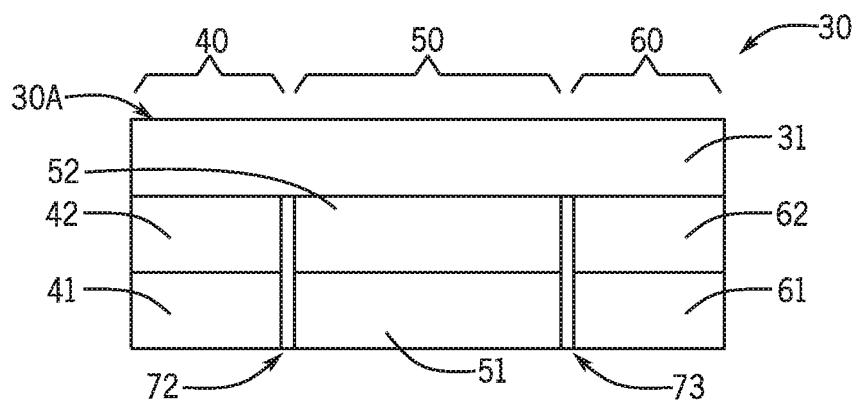
FIG. 8 is a schematic cross-sectional view of another electroluminescent assembly according to an exemplary embodiment.

With additional reference to FIGS. 7 and 8, the electroluminescent assembly 30 includes a plurality of distinct illumination regions that can be individually activated to independently emit light and thereby provide multiple and different types of visual indicators 80. For convenience, the electroluminescent assemblies depicted in FIGS. 7 and 8 do not show the substrate 36, front electrode 32, bus bar 37 or conductive lead 38. However, it will be understood that these layers may be included.

In several embodiments as depicted, the electroluminescent assembly 30 includes a plurality of illumination regions, for example a first illumination region 40, a second illumination region 50, and a third illumination region 60. More or less illumination regions can be provided. The plurality of illumination regions may be defined by a corresponding plurality of dielectric and electrode layers, which may be separated from each other and each may be individually powered so that the associated illumination region that lies above the individually powered dielectric and electrode layer will emit light, while other illumination regions that do not lie there above will not emit light. It should be appreciated that the plurality of illumination regions may be activated at the same time or at different times to provide the real-time visual indicators. Although the various illumination regions are depicted in FIG. 3 as being separated by lines, such depiction is for convenience, and in reality boundaries between the illuminations regions may not be visually perceptible from the passenger compartment 5.

In one embodiment (FIG. 7), the electroluminescent assembly 30 includes three separate dielectric and electrode layers, a common phosphor layer 33 and a common top layer 31. For simplicity, each of the three dielectric and electrode layers are depicted as a single layer. However, it will be understood that the dielectric layer may be separate from the electrode layer. In this embodiment, the electroluminescent assembly 30 includes a first dielectric and electrode layer 41 that defines the first illumination region 40, a second dielectric and electrode layer 51 that defines the second illumination region 50, and a third dielectric and electrode layer 61 that defines the third illumination region 60. The first, second, and third dielectric and electrode layers 41, 51, 61 are electrically isolated by gaps 70, 71, which may be filled with a non-conductive material, such as a non-conductive polymer. Filling the gaps 70, 71 with the non-conductive polymer material may allow the exposed surface 30A of the electroluminescent assembly 30 to appear as a substantially smooth and/or flat surface. This is because the electroluminescent assembly 30 can have little to no difference in its thickness at a location of the gaps 70, 71, since the gaps are filled with the polymer material. In this configuration, the first, second, and third illumination regions 40, 50, 60 can be separately activated to emit light so as to provide different visual indicators 80. In this embodiment and because there is a common phosphor layer 33 and a common top layer 31, the visual indicators 80 can all be presented in a single color light that is emitted by the common phosphor layer 33.

However, a portion of the top layer 31 overlying the various illumination regions may be altered so that the various illumination regions present different color light from each other. For this purpose, the one or more topcoat layers 31, or portions thereof, may include a color converting additive, such as a photoluminescent pigment, that allows the topcoat layer 31, or portion thereof, containing the color converting additive to function as a photoluminescent color conversion layer. In a non-limiting example, the color converting additive is cerium doped YAG and the phosphor layer 33 provides a blue light source that excites the cerium doped YAG to convert a portion of the blue light to yellow light to provide a white light from one or more of the illumination regions, while the other illumination regions emit the blue light. For example, the first illumination region 40 may emit light having a first chromaticity coordinate (e.g. a first color such as white) and one or both of the second and third illumination regions 50, 60 may emit light having a second chromaticity coordinate (e.g. a second color such as blue that is different than the first color). It is to be understood that different phosphorescent materials for the phosphor layer 33 and color converting additives for the topcoat 31 may be used to provide any desired combination of colors of light emitted from the illumination regions.

In another embodiment (FIG. 8), the electroluminescent assembly 30 includes a plurality of separate dielectric and electrode layers, a corresponding plurality of separate phosphor layers, and a common top layer 31. Again for simplicity, each of the plurality of dielectric and electrode layers are depicted as a single layer. However, it will be understood that the dielectric layer may be separate from the electrode layer. This embodiment distinguishes from the embodiment depicted in FIG. 7, because the electroluminescent assembly 30 includes a first phosphor layer 42, a second phosphor layer 52, and a third phosphor layer 62. As depicted, each of the plurality of phosphor layers is situated between only one of the plurality of rear electrodes and a common front electrode. The first, second, and third phosphor layers 42, 52, 62 and the corresponding first, second, and third dielectric and electrode layers 41, 51, 61 are separated by gaps 72, 73 that are filled a non-conductive polymer to electrically isolate the first, second, and third dielectric and electrode layers 41, 51, 61 from each other and to electrically isolate the corresponding first, second, and third phosphor layers 42, 52, 62 from each other. In this configuration, the first, second, and third illumination regions 40, 50, 60 can be separately activated to emit light so as to provide different visual indicators 80. In one aspect, the first, second, and third phosphor layers 42, 52, 62 emit light of different colors (i.e. each of the plurality of phosphor layers emits light that has different chromaticity coordinates than the others of the plurality of phosphor layers), such that the visual indicators 80 can all be presented in three different colors, such as green, red, and yellow for example.

In several embodiments, when the electroluminescent assembly 30 is activated other than during vehicle operation, light emitted by the electroluminescent assembly 30 provides illumination to one or both of an interior of the vehicle and an exterior of the vehicle. In one aspect, such illumination is emitted from a portion of the electroluminescent assembly covering one or both of the first and third facets 24, 26. The portion of the electroluminescent assembly 30 covering the first facet 24 may be a fourth illumination region 90, and the portion of the electroluminescent assembly 30 covering the third facet 26 may be a fifth illumination region 100. In this aspect, the first, second, and third illuminations regions 40, 50, 60 can cover the second facet 25 of the panel 20 such that real-time visual indicators 80 are emitted from the second facet 25. As shown in FIG. 3, the fourth and fifth illumination regions 90, 100 may extend continuously from the lower end 22 of the panel 20 to the upper end 23 of the panel. However, the present disclosure is not limited to such a configuration. In an illustrative example, the fourth and fifth illumination regions 90, 100 may be configured similar to the first, second, and third illumination regions 40, 50, and 60 to provide a variety of different indicators or variations in the color or brightness of any illumination along the first and third facets 24, 26.

Light emitted by the fourth illumination region 90 may be directed to illuminate the entryway 7 of the vehicle 1 and the ground around the entryway 7. Light emitted by the fifth illumination region 100 may be directed to provide ambient lighting to the passenger compartment 5 of the vehicle 1. The fourth and fifth illumination regions may emit light for a predetermined period of time (e.g. starting from when a passenger door is opened), or when a certain condition exists (e.g. when a passenger door is open). In a non-limiting example, the fifth illumination region 100 may be illuminated when the driver or a passenger approaches the vehicle, or when one or more of the vehicle doors is remotely unlocked. In this example, activation of the fifth illumination region 100 may be triggered by a key fob, a cell phone that is in communication with the vehicle, or by another device that is in communication with the vehicle. The color of light emitted by the fourth and fifth illumination regions 90, 100 may or may not be the same as or different from the color of light emitted by the first, second, and third illuminations regions 40, 50, 60. As such, the fourth and fifth illumination regions 90, 100 may each have a phosphor layer that is common to, or separate from, the phosphor layer(s) of the first, second, and third illuminations regions 40, 50, 60. Moreover, the fourth and fifth illumination regions 90, 100 may be separately activated apart from activation of the first, second, and third illuminations regions 40, 50, 60 to thereby emit light independent from the first, second, and third illuminations regions 40, 50, 60. As such, the fourth and fifth illumination regions 90, 100 may each have a dielectric and electrode layer that is separate from the dielectric and electrode layers of the first, second, and third illuminations regions 40, 50, 60.

Although not depicted, it will be understood that the passenger's side (i.e. right side) of the vehicle 1 can be similar to the driver's side of the vehicle 1, and can include a similar A-pillar assembly on the right side of the vehicle 1. As such, it will be understood that the description provided herein with respect to the A-pillar 10 and associated panel 20 and electroluminescent assembly 30 provided thereon for the driver's side of the vehicle 1, may be equally applicable to an A-pillar on the passenger's side of the vehicle 1, wherein the vehicle can include two electroluminescent assemblies as described herein, one on each A-pillar of the vehicle.

Figure 9:
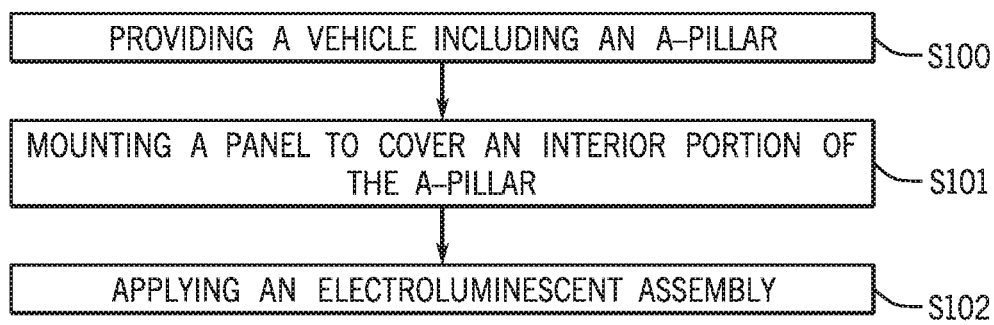
FIG. 9 is a schematic block diagram illustrating an exemplary method of installing an electroluminescent assembly on an A-pillar of a vehicle.

With reference to FIG. 9, a schematic block diagram illustrating a method of installing an electroluminescent assembly on an A-pillar of a vehicle will now be discussed. The method will be described in association with the A-pillar assembly 8 discussed herein (shown in FIGS. 1-8), though this is not required and the method can be used with other vehicle assemblies.

In the method, at S100, a vehicle 1 including an A-pillar 10 is provided. The A-pillar 10 can have a vehicle component 9 mounted to its interior surface 13. It should be appreciated that the steps of the method can be performed on one or both of the A-pillars of the vehicle.

At S101, a panel 20 is mounted to cover an interior portion 13 of the A-pillar 10. The panel 20 includes an interior surface 21 facing away from the A-pillar 10 and towards an interior (e.g. passenger compartment 5) of the vehicle 1. The interior surface 21 of the panel 20 includes a first facet 24, a second facet 25, and a third facet 26. Each of the first, second and third facets 24, 25, 26 extend along a length of the panel 20 between a first end 22 and a second end 23 of the panel. Optionally, the panel may only include one facet, such as with a panel having a continuously curved interior surface.

At S102, an electroluminescent assembly 30 is applied to the interior surface 21 of the panel 20 to cover at least a portion of the interior surface 21, e.g. to cover at least a portion of each of the first, second and third facets 24, 25, 26. The electroluminescent assembly may cover all or a portion of the interior surface of the panel. As depicted in FIGS. 2 and 3, the electroluminescent assembly 30 covers only a portion of the interior surface 21 of the panel 20, but this is not required and more or less of the interior surface of the panel could be covered by the electroluminescent assembly.

The electroluminescent assembly 30 emits light when activated, and can include a plurality of rear electrodes 35 that define a plurality of illumination regions (e.g. illumination regions 40, 50, 60, 90, and 100) on the electroluminescent assembly 30. The plurality of illumination regions can be individually activated to emit light (of the same or different color) by supplying power to one of the plurality of rear electrodes 35. It is to be understood that the illumination of the illumination regions 40, 50, 60, 90, and 100 and any indicators positioned thereon may be selectively operated by the user. In an illustrative example, a controller may be provided for allowing a user to enable or disable any or all of the illumination regions 40, 50, 60, 90, and 100, adjust the brightness of the any or all of the illumination regions 40, 50, 60, 90, and 100, and modify how or when any or all of the illumination regions 40, 50, 60, 90, and 100 are illuminated.

The electroluminescent assembly 30 may be applied to the interior surface 21 of the panel 20 either before or after the panel 20 is mounted to cover the interior portion of the A-pillar. In practical application, this means that the electroluminescent assembly 30 may be applied to the panel 20 by the panel supplier before vehicle assembly, or during or after vehicle assembly, e.g. by the vehicle manufacturer.

Figure 10:
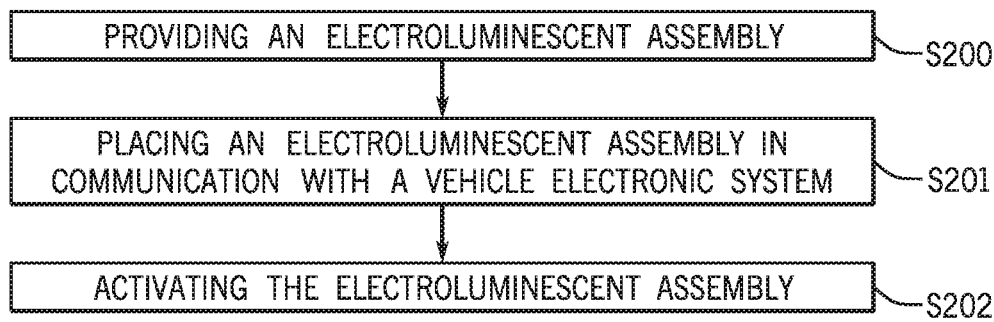
FIG. 10 is a schematic block diagram illustrating an exemplary method of providing real-time visual indicators to an occupant of a vehicle.

With reference to FIG. 10, a schematic block diagram illustrating a method of providing real-time visual indicators to an occupant of a vehicle will now be discussed. The real-time visual indicators can include turn-by-turn directions from a navigation system, blind spot warnings, and a turn signal indicator, for example.

In the method, at S200, an electroluminescent assembly 30 is provided. The electroluminescent assembly emits light when activated, is disposed on an interior surface 21 of a panel 20 that covers an A-pillar 10 of a vehicle 1, and faces a passenger compartment 5 of the vehicle 1. As with the method of FIG. 9, it should be appreciated that the steps of the method can be performed on one or both of the A-pillars of the vehicle.

At S201, the electroluminescent assembly 30 is placed in communication with an electronic system of the vehicle 1, from which data or signals are derived. At S202, the electroluminescent assembly 30 is activated during vehicle operation to provide real-time visual indicators to an occupant of a vehicle based on the signals derived from the vehicle electronic system. The electroluminescent assembly 30 can provide illumination other than the real-time visual indicators, such as general illumination to an interior or exterior of the vehicle provided other than during vehicle operation.

It will be appreciated that several of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. An A-pillar assembly for a vehicle comprising:
a panel covering an interior portion of an A-pillar, the panel having an interior surface and an exterior surface, the interior surface being visible from within an associated passenger compartment and the exterior surface is facing the A-pillar, and
an electroluminescent assembly that emits light when activated, the electroluminescent assembly being disposed on the interior surface of the panel,
wherein the electroluminescent assembly is configured such that light emitted by the electroluminescent assembly during vehicle operation provides real-time visual indicators to a vehicle occupant;
wherein the electroluminescent assembly is in the form of a sheet-like structure including a phosphor layer and defining two major surfaces that are oppositely directed from one another;
wherein one surface of the two major surfaces faces away from the A-pillar and another surface of the two major surfaces faces towards the A-pillar; and
wherein the electroluminescent assembly is configured to emit light from the one surface in a direction away from the A-pillar.

2. The A-pillar assembly of claim 1, wherein:
the electroluminescent assembly includes a plurality of rear electrodes that define a plurality of illumination regions on the electroluminescent assembly, and
the electroluminescent assembly is configured such that power can be individually supplied to each of the plurality of rear electrodes to individually activate the plurality of illumination regions to emit light.

3. The A-pillar assembly of claim 2, wherein at least one of the plurality of illumination regions emits light that has a chromaticity coordinate that is different from the chromaticity coordinates of light emitted by others of the plurality of illumination regions.

4. The A-pillar assembly of claim 3, wherein:
the electroluminescent assembly further includes a plurality of phosphor layers, and
each of the plurality of phosphor layers is between only one of the plurality of rear electrodes and a common front electrode.

5. The A-pillar assembly of claim 1, wherein when the electroluminescent assembly is activated other than during vehicle operation, light emitted by the electroluminescent assembly provides illumination to one or both of an interior of the vehicle or an exterior of the vehicle.

6. The A-pillar assembly of claim 5, wherein:
the interior surface of the panel includes a first facet, a second facet, and a third facet, each of which extend along a length of the panel and are at least partially covered by the electroluminescent assembly, and
the second facet is between the first facet and the third facet,
light that illuminates the interior or the exterior of the vehicle other than during vehicle operation, is emitted from a portion of the electroluminescent assembly covering one or both of the first and third facets, and
the real-time visual indicators are emitted from a portion of the electroluminescent assembly covering the second facet.

7. The A-pillar assembly of claim 6, wherein:
the first facet is closer to a passenger door of the vehicle than the second and third facets, and
the third facet is closer to a front windshield of the vehicle than the first and second facets.

8. A vehicle including an A-pillar and an A-pillar assembly, the A-pillar assembly comprising:
a panel covering an interior portion of the A-pillar, the panel having an interior surface and an exterior surface, the interior surface being visible from within a passenger compartment of the vehicle and the exterior surface is facing the A-pillar, and
an electroluminescent assembly that emits light when activated, the electroluminescent assembly being disposed on the interior surface of the panel,
wherein the electroluminescent assembly is in the form of a sheet-like structure including a phosphor layer and defining two major surfaces that are oppositely directed from one another,
wherein one surface of the two major surfaces faces away from the A-pillar and another surface of the two major surfaces faces towards the A-pillar,
wherein the electroluminescent assembly is configured to emit light from the one surface in a direction away from the A-pillar such that light emitted by the electroluminescent assembly during vehicle operation provides real-time visual indicators to a vehicle occupant, and
wherein the real-time visual indicators including one or more of a blind-spot indicator, a turn signal indicator, and a directional indicator.

9. The vehicle of claim 8, wherein the electroluminescent assembly is configured such that light emitted by the electroluminescent assembly other than during vehicle operation provides illumination to one or both of the interior of the vehicle or an exterior of the vehicle.

10. The vehicle of claim 8, wherein:
the electroluminescent assembly includes a plurality of rear electrodes that define a plurality of illumination regions on the electroluminescent assembly, and
the electroluminescent assembly is configured such that power can be individually supplied to each of the plurality of rear electrodes to individually activate the plurality of illumination regions to emit light.

11. The vehicle of claim 10, wherein at least one of the plurality of illumination regions emits light that has a chromaticity coordinate that is different from the chromaticity coordinates of light emitted by others of the plurality of illumination regions.

12. The vehicle of claim 11, wherein:
the electroluminescent assembly further includes a plurality of phosphor layers, and
each of the plurality of phosphor layers is between only one of the plurality of rear electrodes and a common front electrode.

13. The vehicle of claim 10, wherein:
the interior surface of the panel includes a first facet, a second facet, and a third facet, and
each of the first, second and third facets extend along a length of the panel.

14. The vehicle of claim 13, wherein:
the plurality of illumination regions includes a first illumination region, a second illumination region, a third illumination region, and the first, second and third illumination regions cover the second facet of the panel, and the first, second and third illumination regions provide visual indicators during operation of the vehicle based on real-time signals derived from the vehicle electronic system.

15. The vehicle of claim 14, wherein:

the plurality of illumination regions further includes a fourth illumination region and a fifth illumination region, the fourth illumination region covers the first facet, the fifth illumination region covers the third facet, and at least one of the fourth and fifth illumination regions emits light other than during vehicle operation that provides illumination to one or both of the interior of the vehicle or an exterior of the vehicle.

16. A method of providing real-time visual indicators to an occupant of a vehicle, comprising:

providing an electroluminescent assembly that emits light when activated, the electroluminescent assembly being disposed on an interior surface of a panel that covers an A-pillar of a vehicle, the interior surface of the panel facing a passenger compartment of the vehicle, the panel including an exterior surface facing the A-pillar, the electroluminescent assembly being in the form of a sheet-like structure including a phosphor layer and defining two major surfaces that are oppositely directed from one another, one surface of the two major surfaces faces away from the A-pillar and another surface of the two major surfaces faces towards the A-pillar, placing the electroluminescent assembly in communication with a vehicle electronic system, and activating the electroluminescent assembly during vehicle operation such that the one surface emits light in a direction away from the A-pillar to provide real-time visual indicators to an occupant of the vehicle based on signals derived from the vehicle electronic system.

17. The method of claim 16, wherein:

the electroluminescent assembly includes a plurality of illumination regions, and the plurality of illumination regions are individually activated to emit light and thereby provide the real-time visual indicators.

18. The method of claim 16, further including activating the electroluminescent assembly other than during vehicle operation to emit light that provides illumination to one or both of an interior of the vehicle or an exterior of the vehicle.

19. The method of claim 18, wherein:

the panel includes a first facet, a second facet and a third facet that extend along a length of the panel, the first facet is closer to a passenger door of the vehicle than the second and third facets, the second facet is between the first facet and the third facet, the third facet is closer to a front windshield of the vehicle than the first and second facets, the real-time visual indicators the include one or more of a directional indicator, a blind spot indicator, and a turn signal indicator, a vehicle performance characteristics indicator, a diagnostic information indicator, the real-time visual indicators are emitted from the portion of the electroluminescent assembly covering the second facet, and light that illuminates the interior or the exterior of the vehicle other than during vehicle operation, is emitted from a portion of the electroluminescent assembly covering one or both of the first and third facets.

20. An A-pillar assembly for a vehicle comprising:

a panel covering an interior portion of an A-pillar, the panel having an interior surface and an exterior surface, the interior surface being visible from within an associated passenger compartment and the exterior surface is facing the A-pillar, and an electroluminescent assembly that emits light when activated, the electroluminescent assembly being disposed on the interior surface of the panel, wherein the electroluminescent assembly is configured such that light emitted by the electroluminescent assembly during vehicle operation provides real-time visual indicators to a vehicle occupant;

wherein when the electroluminescent assembly is activated other than during vehicle operation, light emitted by the electroluminescent assembly provides illumination to one or both of an interior of the vehicle or an exterior of the vehicle;

wherein the interior surface of the panel includes a first facet, a second facet, and a third facet, each of which extend along a length of the panel and are at least partially covered by the electroluminescent assembly;

wherein the second facet is between the first facet and the third facet;

wherein light that illuminates the interior or the exterior of the vehicle other than during vehicle operation, is emitted from a portion of the electroluminescent assembly covering one or both of the first and third facets; and wherein the real-time visual indicators are emitted from a portion of the electroluminescent assembly covering the second facet.

21. The A-pillar assembly of claim 20, wherein:

the first facet is closer to a passenger door of the vehicle than the second and third facets, and the third facet is closer to a front windshield of the vehicle than the first and second facets.

22. The A-pillar assembly of claim 20, wherein the real-time visual indicators correspond to signals from an associated electronic system of the vehicle.

23. The A-pillar assembly of claim 20, wherein the electroluminescent assembly includes a plurality of rear electrodes that define a plurality of illumination regions, and the electroluminescent assembly is configured such that power can be individually supplied to each of the plurality of rear electrodes to individually activate the plurality of illumination regions to emit light.

24. The A-pillar assembly of 23, wherein at least one of the plurality of illumination regions emits light that has a chromaticity coordinate that is different from the chromaticity coordinates of light emitted by others of the plurality of illumination regions.

25. The A-pillar assembly of 20, wherein when the electroluminescent assembly is activated other than during vehicle operation, light emitted by the electroluminescent assembly provides illumination to one or both of an interior of the vehicle or an exterior of the vehicle.

26. A vehicle including an A-pillar and an A-pillar assembly, the A-pillar assembly comprising:

a panel covering an interior portion of the A-pillar, the panel having an interior surface and an exterior surface, the interior surface being visible from within a passenger compartment of the vehicle and the exterior surface is facing the A-pillar, and an electroluminescent assembly that emits light when activated, the electroluminescent assembly being disposed on the interior surface of the panel, wherein the electroluminescent assembly is configured such that light emitted by the electroluminescent assembly during vehicle operation provides real-time visual indicators to a vehicle occupant;

wherein the real-time visual indicators including one or more of a blind-spot indicator, a turn signal indicator, and a directional indicator;

wherein the electroluminescent assembly includes a plurality of rear electrodes that define a plurality of illumination regions on the electroluminescent assembly;

wherein the electroluminescent assembly is configured such that power can be individually supplied to each of the plurality of rear electrodes to individually activate the plurality of illumination regions to emit light;

wherein the interior surface of the panel includes a first facet, a second facet, and a third facet;

wherein each of the first, second and third facets extend along a length of the panel;

wherein the plurality of illumination regions includes a first illumination region, a second illumination region, a third illumination region;

wherein the first, second and third illumination regions cover the second facet of the panel;

wherein the first, second and third illumination regions provide visual indicators during operation of the vehicle based on real-time signals derived from the vehicle electronic system;

wherein the plurality of illumination regions further includes a fourth illumination region and a fifth illumination region;

wherein the fourth illumination region covers the first facet;

wherein the fifth illumination region covers the third facet; and wherein at least one of the fourth and fifth illumination regions emits light other than during vehicle operation that provides illumination to one or both of the interior of the vehicle or an exterior of the vehicle.

27. The vehicle of claim 26, wherein the electroluminescent assembly is configured such that light emitted by the electroluminescent assembly other than during vehicle operation provides illumination to one or both of the interior of the vehicle or an exterior of the vehicle.

28. The vehicle of claim 26, wherein at least one of the plurality of illumination regions emits light that has a chromaticity coordinate that is different from the chromaticity coordinates of light emitted by others of the plurality of illumination region.

29. A method of providing real-time visual indicators to an occupant of a vehicle, comprising:

providing an electroluminescent assembly that emits light when activated, the electroluminescent assembly being disposed on an interior surface of a panel that covers an A-pillar of a vehicle, the interior surface of the panel facing a passenger compartment of the vehicle, the panel including an exterior surface facing the A-pillar, placing the electroluminescent assembly in communication with a vehicle electronic system, activating the electroluminescent assembly during vehicle operation to provide real-time visual indicators to an occupant of the vehicle based on signals derived from the vehicle electronic system, and activating the electroluminescent assembly other than during vehicle operation to emit light that provides illumination to one or both of an interior of the vehicle or an exterior of the vehicle;

wherein the panel includes a first facet, a second facet and a third facet that extend along a length of the panel;

wherein the first facet is closer to a passenger door of the vehicle than the second and third facets;

wherein the second facet is between the first facet and the third facet;

wherein the third facet is closer to a front windshield of the vehicle than the first and second facets;

wherein the real-time visual indicators the include one or more of a directional indicator, a blind spot indicator, and a turn signal indicator, a vehicle performance characteristics indicator, a diagnostic information indicator;

wherein the real-time visual indicators are emitted from the portion of the electroluminescent assembly covering the second facet; and wherein light that illuminates the interior or the exterior of the vehicle other than during vehicle operation, is emitted from a portion of the electroluminescent assembly covering one or both of the first and third facets.

30. The method of claim 29, wherein:

the electroluminescent assembly includes a plurality of illumination regions, and the plurality of illumination regions are individually activated to emit light and thereby provide the real-time visual indicators.

* * * * *